United States Patent [19]

Favreau

[11] Patent Number: 4,980,739
[45] Date of Patent: Dec. 25, 1990

[54] SELF-ALIGNED BIPOLAR TRANSISTOR USING SELECTIVE POLYSILICON GROWTH

[75] Inventor: David P. Favreau, Allentown, Pa.

[73] Assignee: Texas Instruments Incorporated, Dallas, Tex.

[21] Appl. No.: 463,896

[22] Filed: Jan. 9, 1990

Related U.S. Application Data

[63] Continuation of Ser. No. 212,542, Jun. 28, 1988, abandoned.

[51] Int. Cl.$^5$ .............................................. H01L 29/72
[52] U.S. Cl. .......................................... 357/34; 357/59
[58] Field of Search ............................... 357/34, 59, 2

[56] References Cited

U.S. PATENT DOCUMENTS 4,782,030 11/1988 Katsumata et al. .............. 357/59 H Primary Examiner—Mark Prenty
Attorney, Agent, or Firm—W. James Brady, III; James T. Comfort; Melvin Sharp

[57] ABSTRACT

A polysilicon self-aligned transistor has a polysilicon layer (24) with a cavity (30) formed therein. To form the polysilicon layer (24) with a cavity (30), a thin seed layer (14) is disposed over an epitaxial layer (11a). Dielectric layers (16, 18) are formed over the seed layer (14), and are subsequently etched to define the polysilicon layer (24) and the cavity (30). The cavity (30) is defined by a dielectric plug (22). The exposed seed layer (14) is used to selectively grow the polysilicon layer (24). Thereafter, the dielectric plug (22) is removed to form the cavity (30) through which the base (32) is implanted into the substrate (12) and the emitter (36) is formed.

4 Claims, 1 Drawing Sheet

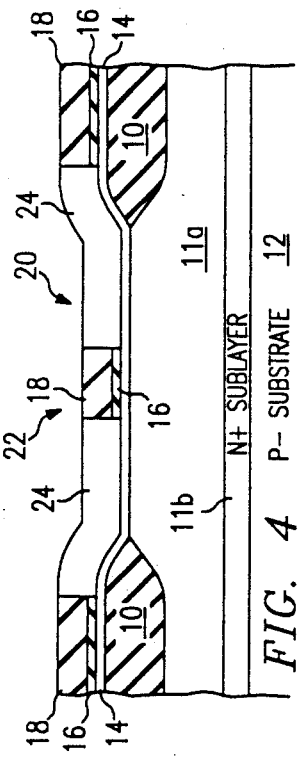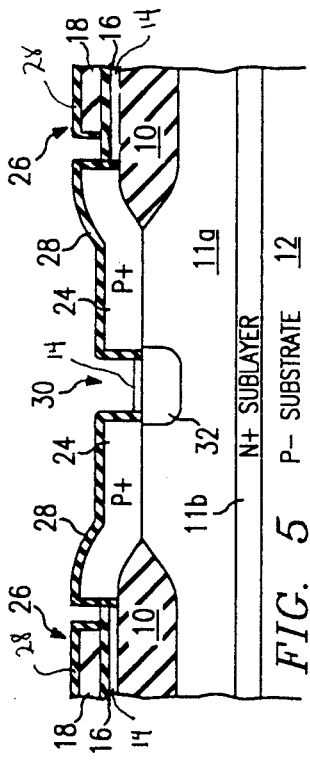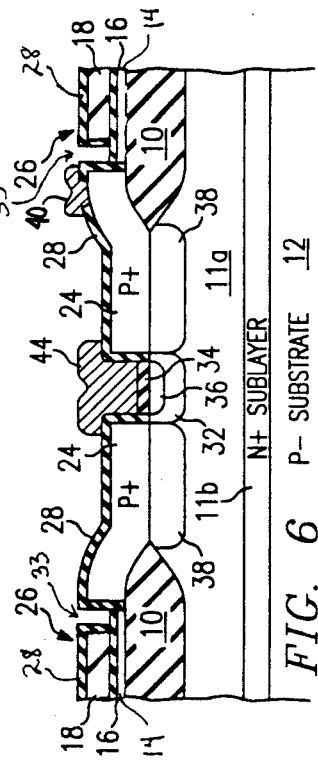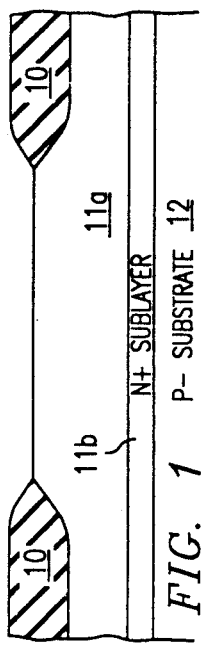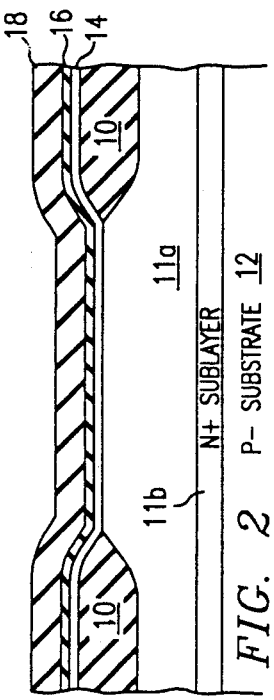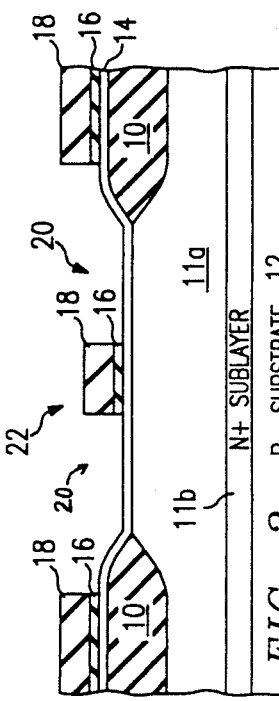

SELF-ALIGNED BIPOLAR TRANSISTOR USING SELECTIVE POLYSILICON GROWTH

This application is a continuation of application Ser. No. 212,542, filed June 28, 1988 and now abandoned.

TECHNICAL FIELD OF THE INVENTION

This invention pertains in general to integrated circuits, and more particularly to fabricating self-aligned transistors.

BACKGROUND OF THE INVENTION

Bipolar transistors can be formed using a polysilicon self-aligned technique, such as disclosed in a pending U.S. patent application, entitled "A Polysilicon Self-Aligned Bipolar Device and Process of Manufacturing the Same," filed Nov. 19, 1986, Ser. No. 932,752 and now U.S. Pat. No. 4,799,099. The subject matter of which is incorporated herein by reference in its entirety. The polysilicon self-aligned transistors have several advantages over prior art transistors.

In forming polysilicon self-aligned bipolar transistors, a P type polysilicon is deposited over a semiconductor surface. The P type polysilicon is patterned to define an opening for the emitter of the transistor. The polysilicon layer is then etched, stopping on bare silicon. Subsequently, a base is diffused through the opening, and an emitter is formed therein.

This process presents several difficulties. The first difficulty concerns etching the polysilicon layer to stop on the bare silicon. Since there is a lack of selectivity between polysilicon and silicon, etching and stopping on silicon without damage to the substrate is very difficult. The second difficulty concerns the very fine geometries printed and etched in the polysilicon to define the window.

Through photographic techniques, such as image reversal, the difficulty of patterning small holes in the polysilicon layer can be minimized. However, once patterned, the difficulty in etching the small holes is not relieved. One way to circumvent the etching problem is to grow the polysilicon layer at the same time the epitaxy layer is being grown, as reported in F. Mieno, et al., "Novel Selective Poly and Epitaxial Silicon Growth Technique for USLI Processing," IEDM Technical Digest, p. 16-19 (1987). Unfortunately, this process will not lead to a fully self-aligned device.

Therefore, a need has arisen in the industry to provide a self-aligned bipolar transistor which avoids the problems associated with stopping an etch on silicon. Furthermore, the polysilicon self-aligned bipolar transistor should be capable of implementation in small geometries.

SUMMARY OF THE INVENTION

In accordance with the present invention, a self-aligned bipolar transistor is provided which substantially eliminates problems associated with prior polysilicon self-aligned bipolar transistors.

In a first aspect of the invention, a polysilicon layer is formed over the semiconductor surface by forming a thin seed layer comprising silicon on the semiconductor surface. A dielectric layer is formed over the seed layer, and is subsequently patterned and etched to define the desired P-doped polysilicon region. In etching the dielectric layer, a plug, corresponding to the desired cavity in the polysilicon region, is left. The polysilicon is grown from the seed layer by nucleation in an epitaxy reactor at approximately 1000° C. at low pressure. The dielectric plug is then removed to provide a window in the polysilicon.

The present invention provides significant technical advantages. The first, photolithography process involves patterning lines in the dielectric, rather than holes in the polysilicon. Since the patterning of lines in the dielectric can be more easily controlled, the cavity can be made to small geometries. Second, there is no etching of the polysilicon down to the semiconductor surface therebelow, thereby preventing the danger of etch-through. Third, the resulting planar device eliminates the potential for N type poly filaments.

BRIEF DESCRIPTION OF THE DRAWINGS

For a more complete understanding of the present invention and the advantages thereof, reference is now made to the following descriptions taken in conjunction with the accompanying drawings, in which:

FIG. 1 illustrates a cross-sectional side view of the transistor of the present invention after a first processing stage;

FIG. 2 illustrates a cross-sectional side view of the transistor of the present invention after a second processing stage;

FIG. 3 illustrates a cross-sectional side view of the transistor of the present invention after a third processing stage;

FIG. 4 illustrates a cross-sectional side view of the transistor of the present invention after a fourth processing stage;

FIG. 5 illustrates a cross-sectional side view of the transistor of the present invention after a fifth processing stage; and FIG. 6 illustrates a cross-sectional side view of the transistor of the present invention after a sixth processing stage.

DETAILED DESCRIPTION OF THE DISCLOSURE

The preferred embodiment of the present invention is best understood by referring to FIGS. 1-6 of the drawings, like numerals being used for like and corresponding parts of the various drawings.

FIG. 1 illustrates a cross-sectional side view of the present invention after a first processing stage. The region in which the transistor will be formed is defined by thermal oxide regions 10 disposed on an N type epitaxial layer 11a overlying a highly doped N type sublayer 11b. The sublayer 11b is formed on a P type silicon substrate 12. The epitaxial layer 11a and sublayer 11b comprise the collector of the transistor, the sublayer 11b being highly conductive for carrying the collector current. Although the present invention is described in connection with an NPN transistor, the same techniques can be used for fabricating a PNP transistor as well.

FIG. 2 illustrates a cross-sectional side view of the present invention after a second processing stage. A seed layer 14 is formed over the substrate 12 and the thermal oxide regions 10. The seed layer 14 may be a polysilicon layer having a thickness of approximately 1,000 Angstroms or less. Alternatively, a seed layer of amorphous silicon may be used. A thin LPCVD (low pressure chemical vapor deposition) nitride layer 16 of about 1,000 Angstroms is formed over the seed layer 14. An oxide layer 18, typically a deposited tetraethylorthosilane (TEOS) of about 0.5 micrometers, is formed over the nitride layer 16.

FIG. 3 illustrates a cross-sectional side view of the transistor of the present invention after a third processing stage. The nitride and oxide layers 16 and 18 are patterned and etched using well known photographic techniques to define the desired region 20 in which the polysilicon layer is to be formed. A plug 22 of the remaining nitride and oxide layer 16 and 18 is left to define a cavity in the polysilicon layer to be formed in a later step.

FIG. 4 illustrates a cross-sectional side view of the transistor of the present invention after a fourth processing stage. A polysilicon layer 24 is grown in the region 20 by nucleating the seed layer 14 in epitaxy reactor at approximately 1,000° C. at low pressure. The polysilicon may be grown to a height of the remaining oxide layer 18 to provide a planar surface.

FIG. 5 illustrates a transistor of the present invention after a fifth processing stage. The polysilicon layer 24 is implanted with a dopant, such as boron, to render it conductive. The oxide portion of the plug 22 is removed by etching. Outside dielectric portions 26 may be masked at this time to increase the field oxide thickness over the collector, thereby reducing the capacitance between the substrate and the first metal layer. Alternatively, the outside dielectric portions 26 may be removed.

After removing the oxide portion of the plug 22, the polysilicon layer 24 is oxidized to form an oxide layer 28 having a thickness of approximately 3,000 Angstroms. Thereafter, the remaining nitride portion of the plug 22 is removed by etching. Preferably, a wet chemical etch would be used to avoid damage to the underlying silicon layer. As a result, a cavity 30 is opened through the polysilicon layer 28 to the underlying substrate 12. An intrinsic base region 32 is implanted through the remaining seed layer 14 into the epitaxy layer 11a through the cavity 30.

If the dielectric layers 26 are not removed, the seed layer 14 remaining under the outside dielectric layers 26 may be capable of conducting current between devices. Hence, if a planar structure is desired, it will be necessary to isolate the polysilicon layer 24 from the seed layer 14. This can be accomplished by patterning and etching the seed layer 14 prior to forming the nitride layer 16; however, this process would require an additional masking step.

A second technique would be to etch slots 33 adjacent to the P- polysilicon layer 24 during removal of the oxide layer 18 from the cavity 30. Consequently, the sidewall of the polysilicon layer 24 will be exposed and the subsequent oxidation forming the oxide layer 28 will result in an oxide layer extending through the nitride layer 16 and seed layer 14 to provide electrical insulation. Since the nitride layer 16 is relatively thin, sufficient encroachment to provide isolation should not be a problem.

FIG. 6 illustrates the transistor of the present invention after a sixth processing stage. An emitter polysilicon layer 34 is formed at the bottom of the cavity 30 using a selective growth process, or by depositing a film of polysilicon followed by an etch.

The emitter polysilicon layer 34 is heavily doped and is in contact with the underlying intrinsic base region 32. An emitter region 36 is formed by the diffusion of the N type impurities from the emitter polysilicon layer 34 into the intrinsic base region 32. The semiconductor wafer is typically heated to a predefined temperature for a certain time period to drive the N type impurities for a specified distance into the intrinsic base region 32. During the thermocycling attendant with the processing of the wafer, the P type impurities from the polysilicon layer 24 are driven downward to form extrinsic base regions 38. The extrinsic base regions 38 are also partially formed during previous thermocycling steps, such as the diffusion of the intrinsic base region 32. The extrinsic base regions 38 are driven into the collector layer 11a into contact with the intrinsic base region 32.

An opening is formed at a remote location over the oxide layer 28 to provide access to the polysilicon layer 24. A metal or other electrical conductor 40 may be formed in contact with the polysilicon layer 24 to provide an electrical connection to the intrinsic base 32 via the extrinsic base regions 38. Another electrical conductor 44 is provided to contact the emitter polysilicon layer 34 to provide an electrical connection to the emitter 36. Electrical connections (not shown) are also made to the collector layers 11a-b.

The present invention provides significant advantages over the prior art. Since the photolithographic process involves patterning lines in the the dielectric layers 16 and 18, rather than patterning holes in a layer of polysilicon, the photolithographic process may be performed usually using conventional techniques. Also, the problems associated with etching through a polysilicon and accurately stopping on the underlying semiconductor surface are avoided. Further, the technique offers a well-planarized device structure which eliminates the potential for N-polysilicon filaments.

Although the present invention has been described in detail, it should be understood that various changes, substitutions and alterations can be made herein without departing from the spirit and scope of the invention as defined by the appended claims.

What is claimed is:

1. A self-aligned transistor, comprising:
   a semiconductor substrate of a first conductivity type;
   an epitaxial layer of a second conductivity type formed on the surface of the substrate;
   an oxide layer formed over regions of the epitaxial layer, a device region being defined between the regions of the epitaxial layer over which the oxide layer has been formed;
   a seed layer of silicon formed over the surface of the oxide layer and the surface of the device region, the seed layer having first and second portions, the first portion overlying the device region and portions of the oxide layer around the device region;
   a polysilicon layer of the first conductivity type grown from the first portion of the seed layer, the polysilicon layer having outer sidewalls overlying the oxide layer and inner sidewalls overlying the device region, the first portion of the seed layer becoming a part of the polysilicon layer and the second portion of the seed layer being undoped;
   an intrinsic base region formed in alignment with the inner sidewalls of the polysilicon layer;
   a first insulating layer formed on the inner sidewalls of the polysilicon layer;
   a polysilicon region of the second conductivity type disposed adjacent to the first insulating layer, the polysilicon region defining an emitter region within said intrinsic base region;

an extrinsic base region, the extrinsic base region being formed in alignment with the oxide layer surrounding the device region; and a second insulating layer formed on the outer sidewalls of the polysilicon layer to electrically isolate said polysilicon layer from said second portion of said seed layer.

2. The transistor of claim 1 wherein said seed layer comprises a polysilicon layer.

3. The transistor of claim 1 wherein said seed layer comprises a layer of amorphous silicon.

4. The transistor of claim 1 wherein said first and second insulating layers comprise thermal oxide layers.

* * * * *